(12) United States Patent
Johnson et al.

(10) Patent No.: US 8,049,150 B2
(45) Date of Patent: Nov. 1, 2011

(54) SOLAR COLLECTOR WITH END MODIFICATIONS

(75) Inventors: Eric C. Johnson, Mountain View, CA (US); James L. Bilodeau, San Mateo, CA (US); Jason R. Wells, San Francisco, CA (US); John L. Nightingale, Portola Valley, CA (US); Marc A. Finot, Palo Alto, CA (US)

(73) Assignee: Skyline Solar, Inc., Mountain View, CA (US)

( * ) Notice: Subject to any disclaimer, the term of this patent is extended or adjusted under 35 U.S.C. 154(b) by 54 days.

(21) Appl. No.: 12/685,615

(22) Filed: Jan. 11, 2010

(65) Prior Publication Data
US 2010/0175740 A1 Jul. 15, 2010

Related U.S. Application Data

(60) Provisional application No. 61/144,057, filed on Jan. 12, 2009.

(51) Int. Cl.
*H01L 31/052* (2006.01)
(52) U.S. Cl. .................. 250/203.4; 136/246; 126/684
(58) Field of Classification Search .............. 250/203.4, 250/203.5; 136/246, 248; 126/680, 684–686, 126/690, 694
See application file for complete search history.

(56) References Cited

U.S. PATENT DOCUMENTS

| | | | |
|---|---|---|---|
| 1,830,375 A | 11/1931 | Shoop | |
| 3,760,624 A | 9/1973 | Robinson | |
| 4,220,136 A * | 9/1980 | Penney | 126/600 |
| 4,243,019 A | 1/1981 | Severson | |
| 4,315,500 A | 2/1982 | Gonder | |
| 4,337,758 A | 7/1982 | Meinel et al. | |
| 4,571,812 A | 2/1986 | Gee | |
| 4,583,520 A | 4/1986 | Dietrich et al. | |
| 4,611,575 A | 9/1986 | Powell | |
| 5,038,858 A | 8/1991 | Jordan et al. | |
| 5,058,565 A | 10/1991 | Gee et al. | |
| 5,286,305 A | 2/1994 | Laing et al. | |
| 5,288,337 A | 2/1994 | Mitchell | |
| 5,374,317 A | 12/1994 | Lamb et al. | |
| 5,498,297 A | 3/1996 | O'Neill et al. | |

(Continued)

FOREIGN PATENT DOCUMENTS

DE 20314372 1/2004

(Continued)

OTHER PUBLICATIONS

International Search Report dated Apr. 16, 2009 in PCT Application No. PCT/US2008/075250.

(Continued)

*Primary Examiner* — Kevin Pyo
(74) *Attorney, Agent, or Firm* — Beyer Law Group LLP

(57) ABSTRACT

In one embodiment, a concentrating solar energy collector, which tracks movements of the sun along one axis has a reflective trough, at least one solar receiver mounted above the reflective trough and configured so that incident sunlight striking the reflective trough is directed toward the at least one solar receiver, and a reflector extender coupled to a first end of the reflective trough and configured to capture and direct incident sunlight towards the at least one solar receiver. In another embodiment, one or more extended end reflectors is attached with a reflective trough of a solar energy collector.

16 Claims, 15 Drawing Sheets

U.S. PATENT DOCUMENTS

| | | | |
|---|---|---|---|
| 5,722,145 | A | 3/1998 | Haushalter et al. |
| 5,771,966 | A | 6/1998 | Jacoby |
| 5,851,309 | A * | 12/1998 | Kousa .......................... 136/248 |
| 5,961,739 | A | 10/1999 | Osborne |
| 6,020,554 | A | 2/2000 | Kaminar et al. |
| 6,260,610 | B1 | 7/2001 | Biber et al. |
| 6,276,359 | B1 | 8/2001 | Frazier |
| 6,399,874 | B1 | 6/2002 | Olah |
| 6,401,807 | B1 | 6/2002 | Wyler et al. |
| 6,508,301 | B2 | 1/2003 | Marsala |
| 6,615,909 | B2 | 9/2003 | Fast |
| 6,861,293 | B2 | 3/2005 | Soule |
| 6,870,087 | B1 | 3/2005 | Gallagher |
| 6,978,827 | B2 | 12/2005 | Armstrong |
| 6,994,082 | B2 | 2/2006 | Hochberg et al. |
| 7,065,873 | B2 | 6/2006 | Kang et al. |
| 2005/0139210 | A1 | 6/2005 | Eickhoff |
| 2006/0225730 | A1 | 10/2006 | Anderson |
| 2006/0266407 | A1 | 11/2006 | Lichy et al. |
| 2007/0089777 | A1 | 4/2007 | Johnson, Jr. et al. |
| 2007/0144578 | A1 | 6/2007 | Cunningham et al. |
| 2007/0272295 | A1 | 11/2007 | Rubin et al. |
| 2008/0134497 | A1 | 6/2008 | Corrales et al. |
| 2008/0135085 | A1 | 6/2008 | Corrales et al. |
| 2008/0135086 | A1 | 6/2008 | Corrales |
| 2008/0142319 | A1 | 6/2008 | Manter |
| 2008/0308094 | A1 | 12/2008 | Johnston |
| 2009/0056698 | A1 | 3/2009 | Johnson et al. |
| 2009/0056785 | A1 | 3/2009 | Johnson et al. |
| 2009/0056786 | A1 | 3/2009 | Johnson et al. |
| 2009/0056787 | A1 | 3/2009 | Johnson et al. |

FOREIGN PATENT DOCUMENTS

| | | |
|---|---|---|
| JP | 53-131781 | 11/1978 |
| WO | WO 01/63665 | 8/2001 |
| WO | WO 03/098705 | 11/2003 |
| WO | WO 2004/114419 | 12/2004 |
| WO | WO 2005/006435 | 1/2005 |
| WO | WO 2006/083742 | 8/2006 |
| WO | WO 2007/088474 | 8/2007 |
| WO | WO 2008/013976 | 1/2008 |
| WO | WO 2008/022409 | 2/2008 |

OTHER PUBLICATIONS

Written Opinion dated Apr. 16, 2009 in PCT Application No. PCT/US2008/075250.
International Search Report in PCT Application No. PCT/US2008/075247 dated Nov. 30, 2009.
Written Opinion in PCT Application No. PCT/US2008/075247 dated Nov. 30, 2009.
International Preliminary Report on Patentability in PCT Application No. PCT/US2008/075250 dated Dec. 7, 2009.
International Preliminary Report on Patentability in PCT Application No. PCT/US2008/075247 dated Jan. 21, 2010.
Robinson Fin website: http://www.robfin.com/portals/0/R600006%20ruffled%20Model%20(1) downloaded on Apr. 17, 2009.
U.S. Appl. No. 29/324,036, filed Sep. 4, 2008.
"Continuing Testing Materials and Concepts," Solar20, www.solar20.com/SE/EN/1210-EN_prototype2.php, 2003 (1 page).
"Solar Power for a Sustainable World," Abengoa Solar IST, www.solucar.es/sotes/solar/en/tec_ccp.jsp, printed from online Apr. 15, 2008 (4 pages).
Alarte et al. "Design, Construction and Measurement of a Single-Minor Two-Stage (SMTS) Photovoltaic Concentrator." $2^{nd}$ World Conference and Exhibition on Photovoltaic Solar Energy Conversion, Vienna, Austria, Jul. 6-10, 1998.
Invitation to Pay Additional Fees in PCT Application No. PCT/US2008/075250 dated Feb. 10, 2009.
Mohedano et al., "Design of a Simple Structure for the D-SMTS Concentrator," 16th European Photovoltaic Solar Energy Conference, Glasgow, UK 2000, pp. 2563-2566.
Mohedano et al., "Design, Construction and Measurement of a Dielectric-Single Mirror Two Stage (DSMTS) Photovoltaic Concentrator," *Proc. of the SPIE*, 4446, 2002, pp. 20-31.
Partial International Search Report dated Feb. 11, 2009 in PCT Application No. PCT/US2008/075247.
Sala et al., "480 kWpeak EUCLIDES™ Concentrator Power Plant Using Parabolic Troughs," Springer Berlin / Heidelberg, ISSN 0342-4111, 2007 (6 pages).
Smeltink et al., "40kW PV Thermal Roof Mounted Concentrator System," Energy Conversion, Conference Record of the 2006 IEEE 4th World Conference on vol. 1, May 2006 (4 pages).
Smeltink et al., "The ANU 20kW PV/Trough Concentration," Conference paper, 1999 (4 pages).
Wenham et al., "Applied Photovoltaics" Second Edition, Earthscan, ISBN-10:1-84407-401-3, 2007 (7 pages).
Whitefield et al. "The Development and Testing of Small Concetrating PV Systems." Solar Energy, Pergamon Press. Oxford, GB, vol. 67, No. 1-3, pp. 23-34, Jul. 1, 1999.
Winston et al., "Nonimaging Optics," Elsevier Academic Press, ISBN-13:978-0-12-759751-5, 2005 (10 pages).
Notice of Allowance dated Mar. 26, 2010 from U.S. Appl. No. 12/100,726.
"Industrial Solar Energy," Menova Energy Inc., 2006, 5 pages.
International Search Report dated Aug. 20, 2010 in PCT Application No. PCT/US2010/020723.
Written Opinion dated Aug. 20, 2010 in PCT Application No. PCT/US2010/020723.
Sala et al., "The 480 kWp EUCLIDES™—Thermie Power Plant: Installation, Set-Up and First Results," 2000, 6 pages.
Database WPI Week 200735, Thomson Scientific, London, GB; AN 2007-370318, XP002512878 & RU 2300058C2 abstract, Apr. 2, 2009.

* cited by examiner

SOLAR COLLECTOR WITH END MODIFICATIONS

CROSS-REFERENCE TO RELATED APPLICATIONS

This application claims priority to U.S. Provisional Patent Application No. 61/144,057, entitled "Solar Collector with End Modifications," filed Jan. 12, 2009, which is hereby incorporated by reference in its entirety for all purposes.

FIELD OF THE INVENTION

The present disclosure relates generally to solar energy collecting systems, and more particularly to concentrating solar energy collecting systems.

BACKGROUND OF THE INVENTION

The highest cost components of a solar photovoltaic (PV) system are the solar cells that convert sunlight to electricity by the photoelectric effect. To use these cells more effectively, concentrating photovoltaic (CPV) systems focus sunlight from a larger aperture onto a smaller cell area. Although many CPV designs have been developed from the very beginning of the commercial PV industry in the 1960's, not one has achieved significant commercial success. Although CPV designs use less active cell material, they typically require additional structure such as minors, lenses and heat sinks, and are fundamentally limited to utilizing less then all of the total available light. These factors increase cost and system complexity and reduce the optical-to-electrical efficiency over non-concentrating PV systems.

Although existing concentrating solar PV systems address some applications, there are continuing efforts to further improve the design and cost effectiveness of concentrating PV system.

OVERVIEW

A solar energy collection system is provided. A concentrating solar energy collector, which tracks movements of the sun along one axis, can have a reflective trough, at least one solar receiver mounted above the reflective trough and configured so that incident sunlight striking the reflective trough is directed toward the at least one solar receiver, and a reflector extender coupled to a first end of the reflective trough and configured to capture and direct incident sunlight towards the at least one solar receiver.

In another embodiment, the concentrating solar energy collector, which tracks movements of the sun along one axis, can have a reflective trough, at least one solar receiver mounted above the reflective trough and configured so that incident sunlight striking the reflective trough is directed toward the at least one solar receiver, and a solar end reflector coupled to a first end of the reflective trough and configured to capture and direct reflected incident sunlight towards the at least one solar receiver.

In still another embodiment, the concentrating solar energy collector, which tracks movements of the sun along one axis, can have a reflective trough having a first end, a second end, and a central region between the first end and the second end, a plurality of end receivers mounted above the reflective trough along a longitudinal axis at the first end and the second end, the plurality of receivers configured to receive incident sunlight reflected from the reflective trough, and a plurality of central receivers mounted above the reflective trough along a longitudinal axis at the central region, the plurality of receivers configured to receive incident sunlight reflected from the reflective trough, wherein the plurality of end receivers and the plurality of central receivers have different electrical configurations.

In another embodiment, a concentrating solar energy collector with one or more extended end reflectors is described. The attached extended end reflectors help prevent the undesirable escape of reflected sunlight and direct additional light towards one or more solar receivers on the collector. The collector includes a reflective trough that extends along a longitudinal collector axis. One or more solar receivers are mounted on the reflective trough. One or more extended end reflectors are attached with ends of the reflective trough. Each extended end reflector includes a reflector extender and an end cap. The reflector extender has a section with a trough-like shape that matches that of the reflective trough such that the reflector extender helps to extend reflective surfaces of the collector beyond the reflective trough. A first end of the reflector extender is coupled to an end of the reflective trough. An opposing second end of the reflector extender is coupled with and covered by the end cap. In various embodiments, the extended end reflector may also include a receiver extension region and/or a end wall arranged to receive and scatter light reflected off of the reflective trough.

These and other features will be presented in more detail in the following detailed description of the invention and the associated figures.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations.

In the drawings.

DESCRIPTION OF EXAMPLE EMBODIMENTS

Embodiments are described herein in the context of a solar collector with end modifications. The following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Example Solar Collector

Figure 1A:
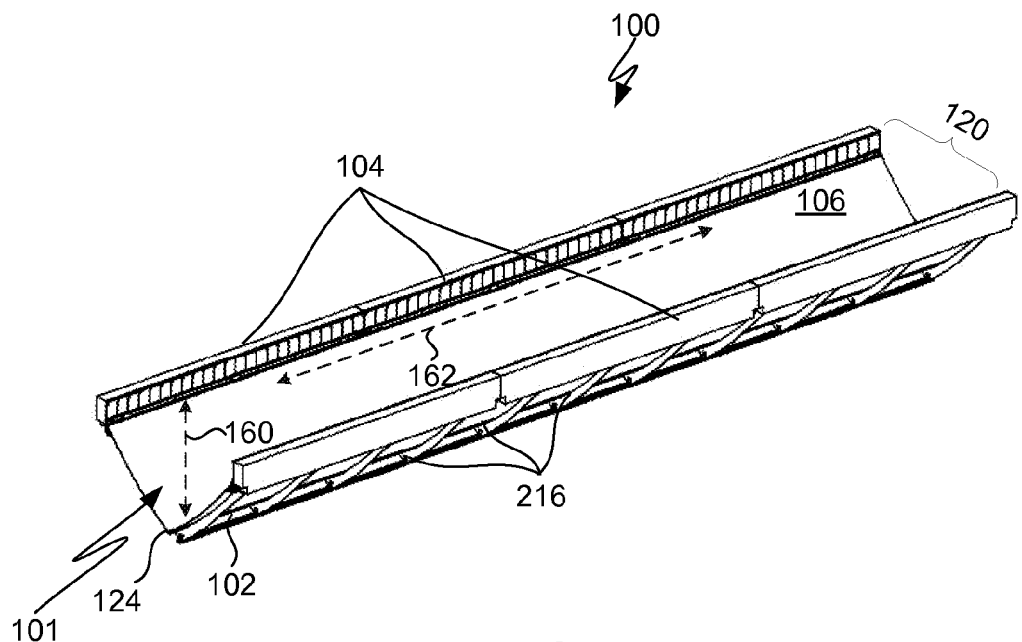
FIGS. 1A-1D illustrate an embodiment of a single trough solar energy concentrator or collector.
Figure 1B:
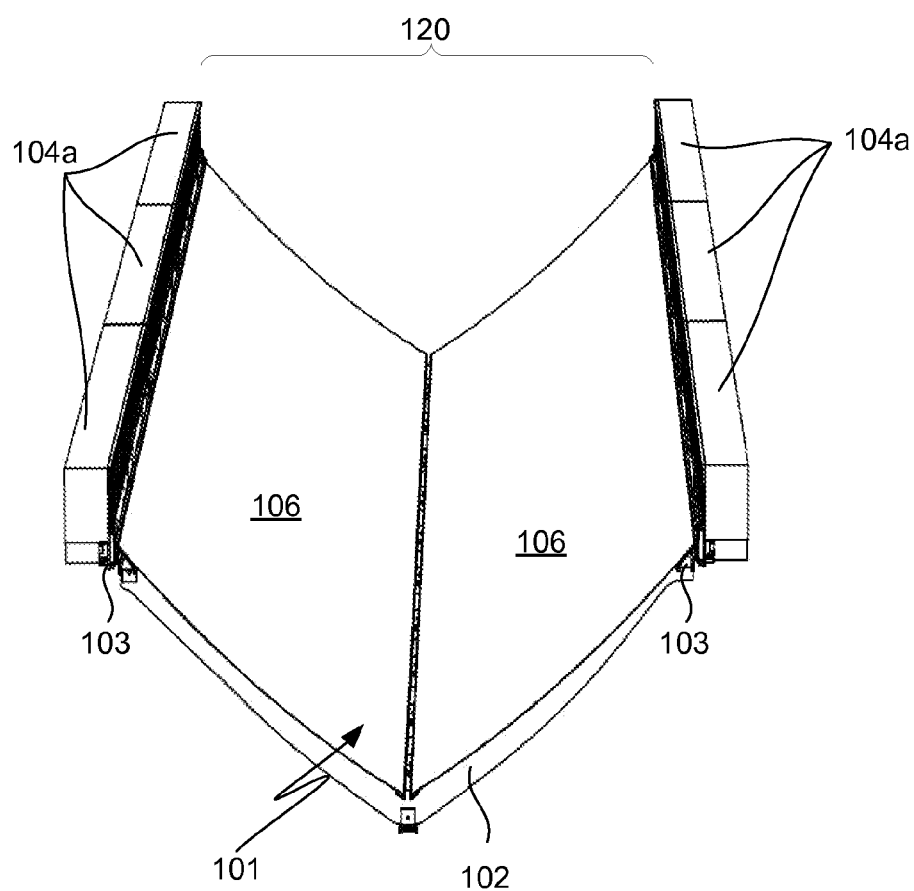

Although an example one-dimensional tracking solar energy collector is described, this is not intended to be limiting as any type and style of trough collector may be used. By way of example, any collector described in patent application Ser. No. 12/100,726, entitled "Dual Trough Concentrating Solar Photovoltaic Module," filed Apr. 10, 2008, which is hereby incorporated by reference in its entirety for all purposes, may be used in connection with any of the embodiments, features and components described herein. FIGS. 1A-1D illustrate an embodiment of a single trough solar energy concentrator or collector. FIG. 1A is a perspective view of the single trough solar energy collector and FIG. 1B is a top perspective view of the single trough solar energy collector. The collector 100 has an optical aperture 101 designed to admit incident sunlight onto reflector panels 106. A support structure 102 is arranged to support reflector panels 106 and reflector panels 106 are attached to the support structure 102. The collector 100 may have a base 124 and a pair of reflective side walls formed from the reflector panels 106. The collector 100 may be configured so as to direct incident sunlight entering collector 100 through the optical aperture 101 toward a region slightly above a top edge of the opposing reflector panel 106.

The support structure 102 may be composed of a plurality of shaping ribs 216. The collector 100 also has a plurality of receivers or solar receivers 104 coupled near the top edges of the collector 100. The solar receivers may be passively cooled (such as with air using a finned heat sink) or actively cooled (such as with cooling fluids in a pipe).

Each collector 100 has a longitudinal axis 162 and an optical aperture 101. For the purposes of this explanation, we utilize the term aperture to refer to the effective trough opening that exists when the collector is directly facing the sun. We also use the term normal axis 160 (or aperture axis or lateral axis) to refer to a geometric axis that is perpendicular to the longitudinal axis and parallel to incident solar radiation when the collector is facing directly towards the sun. However, for collection of sunlight by the collector, the sun does not need to be directly overhead. In one embodiment, the collector trough 120 has a curvature resembling that of a quarter section of a parabola 132. In other words, the curvature of the trough may approximate an arc of a circle or any other geometry that provide suitable concentration of the sunlight at the targeted receivers. In the quarter section embodiment, the trough 120 may be composed of two quarter section of a "full" or traditional parabola having the same focus. Although described as a quarter section of a parabola, this description is not intended to be limiting as the trough 120 may be any size or shape, such as a parabola, arc, multiple linear or curved segments, and the like.

The support structure 102 may support or hold a plurality of reflector panels 106. The reflector panels 106 may be shaped by elastic deformation against shaping ribs 216 of the support structure 102. In one embodiment, the reflector panels 106 may be plastically formed with a curvature. Thus, the reflector panels 106 may be supported and held by the structure 102 with a curvature resembling a quarter parabolic configuration. Quarter parabolic troughs and other trough embodiments are further discussed in co-pending patent application Ser. No. 12/124,121, entitled "Photovoltaic Receiver", filed May 20, 2008, which is incorporated herein by reference for all purposes and will not be discussed herein for brevity.

Figure 1C:
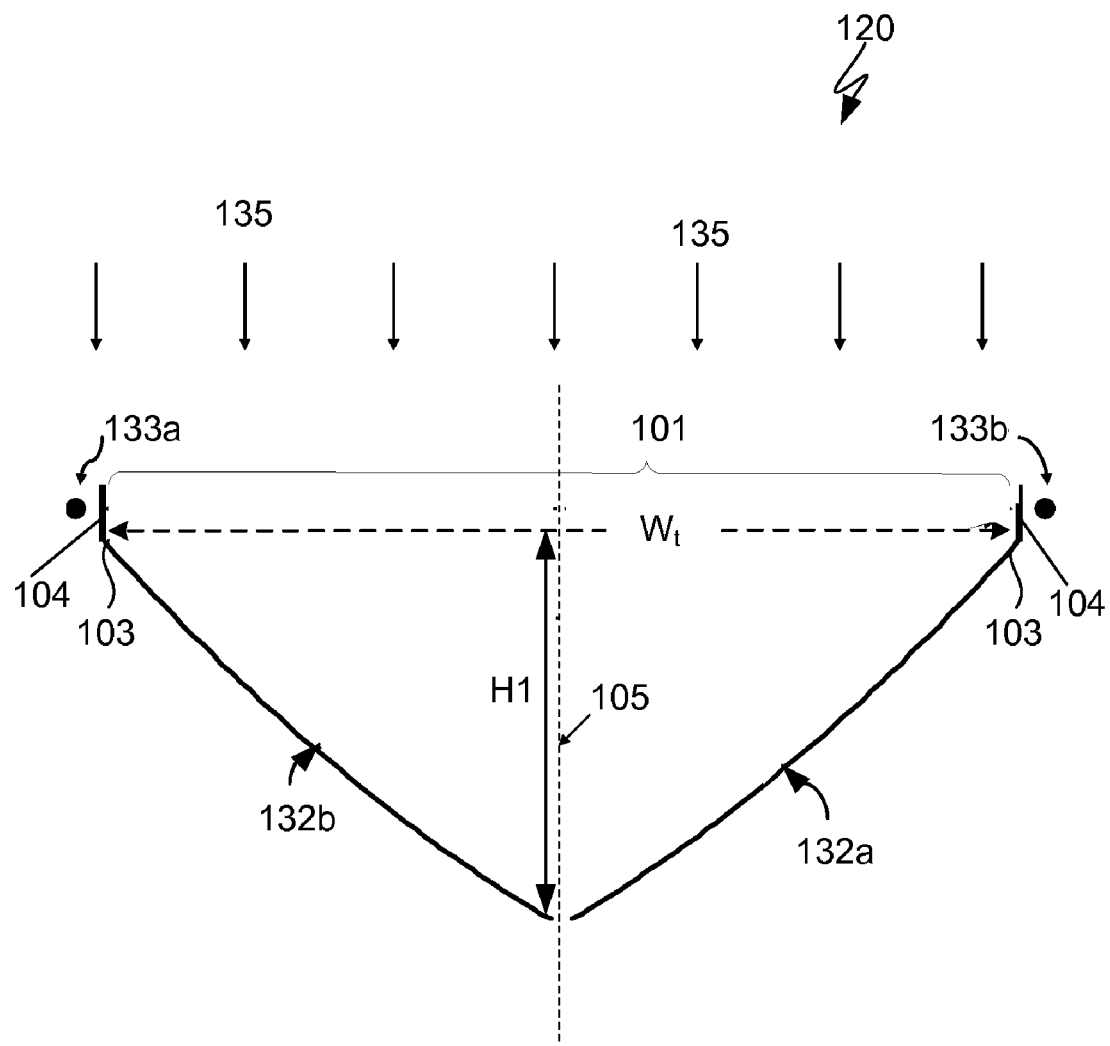

FIG. 1C illustrates a cross-sectional view of an example trough. In the illustrated embodiment, the width of the trough optical aperture is $W_t$. The trough may be divided into halves as shown with bisecting plane 105. The focus for one side of the trough is near the top edge of the opposing side of the trough. For example, the focus for reflector 132a is at 133a and the focus for reflector 132b is at 133b. The quarter parabola trough configuration or shape is configured to direct the focus of the trough 120 to a location just above the far edge of the opposing trough segment. This allows the solar receivers 104 to be located where they will not shade the reflector panels 106. Additionally, the solar receivers 104 may be attached to the support structure 102 near or on the trough edges 103 without the use of struts that extend over the faces of the reflector panels. Traditionally, installing struts over the trough opening creates a closed shaped truss. The struts cast shadows over the reflector panels, which results in a less efficient PV design. The quarter parabola trough configuration allows for the solar receivers 104 to be located at the edges of each trough in the trough 120. The solar receivers 104 and any structural elements such as a stand, support structure, or frame thus do not cast a shadow over the reflector panels 106, which results in a more efficient solar energy collector 100.

Figure 1D:
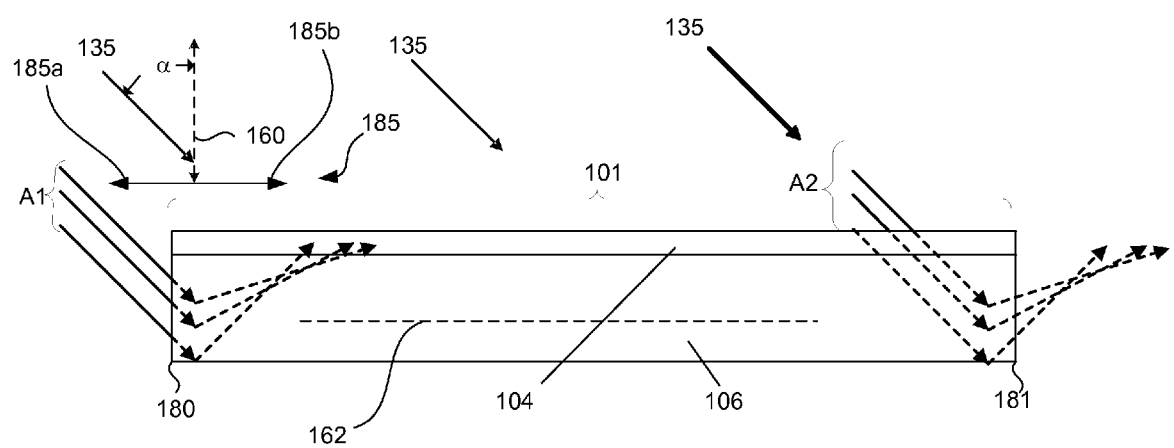

FIG. 1D illustrates a side view of the collector, without the shaping ribs, showing representative angles of the solar insolation relative to the trough. As illustrated, incoming solar insolation 135 is generally not perpendicular to the trough aperture. The path of the incoming solar insolation 135 is illustrated by arrows A1 and A2. The incoming solar insolation 135 enters the collector at an angle of incidence (AOI) a relative to the normal axis 160. The angle of incidence is always defined as a positive number. The rays illustrated by arrows A1 are reflected off the reflector 106 near one end of the trough 180 and directed to an opposing receiver 104 opposite the reflector 106. The rays illustrated by arrows A2 reflected off the reflector 106 near opposite end of the trough 181 and escape out the trough end. The reflector panel 106 shape and orientation may cause rays which reflect from the panel farther from the trough bottom (higher in the trough) to strike the opposing receiver farther from the reflection point as shown in FIG. 1D.

Figure 9:
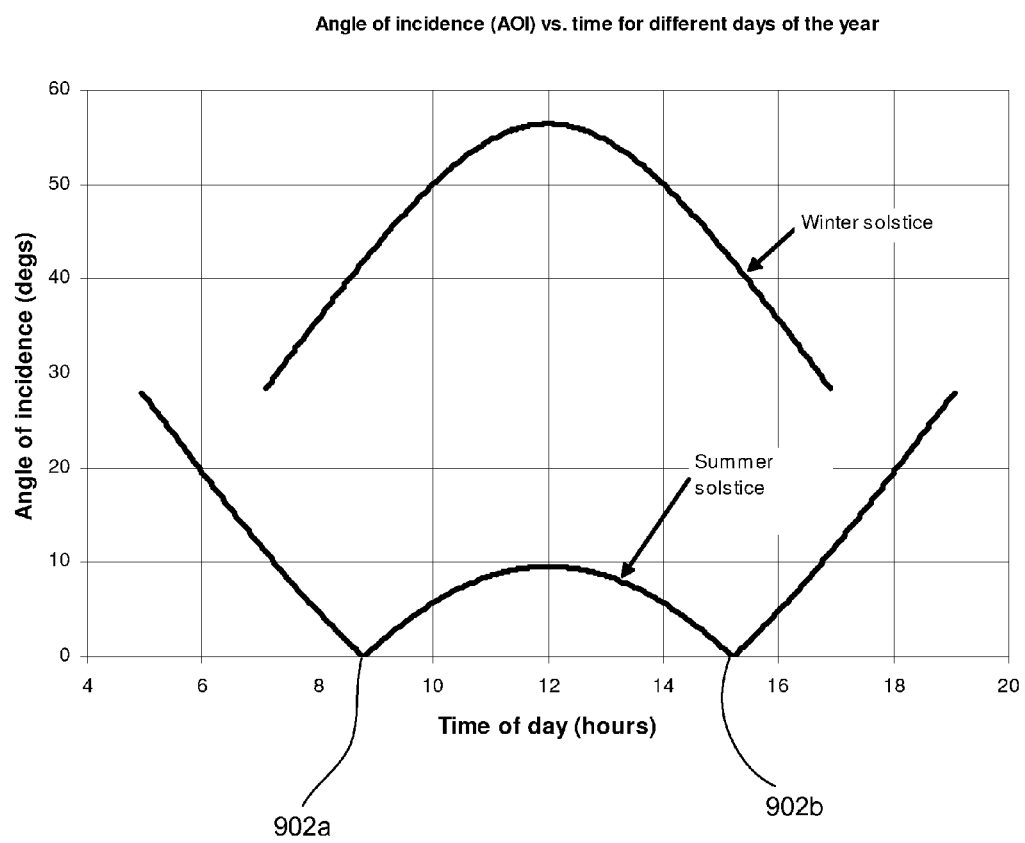
FIG. 9 is a graph that illustrates the angle of incidence of incoming solar insolation as a function of time according to one embodiment of the present invention.

The angle between the normal axis 160 and the incoming solar insolation 135 may vary based upon the hour of day and the season as the collector tracks the sun along one axis by tilting or rotating the collector. The angle of incidence a may increase, decrease and/or change its sense over time. (A "change of sense" may be understood to mean that the end of the trough where rays escape the trough has changed. For example in FIG. 1D the rays are shown escaping from end 181 of the trough. If the AOI had a different sense, the rays would be reflected out of the opposite end 180. Another way of understanding a change of sense is as a shift in the direction of the incoming insolation 135 with respect to reference axis 185. That is, a change in sense has taken place when rays of incoming solar insolation 135 shift from traveling at least partly in a direction 185b to traveling at least partly in a direction 185a, or vice versa. Reference axis 185 is perpendicular to the nominal axis 160 and parallel to the longitudinal axis 162 of the collector.) For example, if the collector 100 of FIG. 1 is mounted horizontally in a north-south orientation (e.g., such that the longitudinal axis 162 of the collector 100 is substantially parallel to a line of longitude of the earth), the angle of incidence a at solar noon is the location latitude +/−23.5° (the approximate tilt axis of the earth), at the summer and winter solstice, respectively. FIG. 9 shows the approximate variation in the angle of incidence a throughout the day for a north-south oriented collector 100 at 33° latitude for the summer and winter solstice. The inflection points 902a and 902b in the summer solstice curve near 9 and 15 hours correspond to a change in the sense of the angle of incidence α. That is, at inflection points 902a and 902b the angle of incidence α passes through zero and the trough end where sunlight escapes changes.

Example Solar Receiver

Figure 2A:
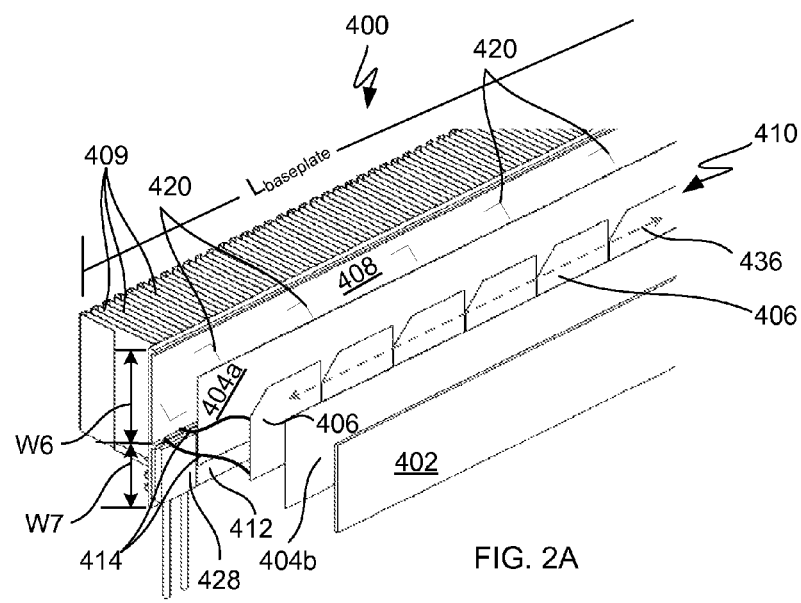
FIGS. 2A and 2B illustrate an example solar receiver.
Figure 2B:
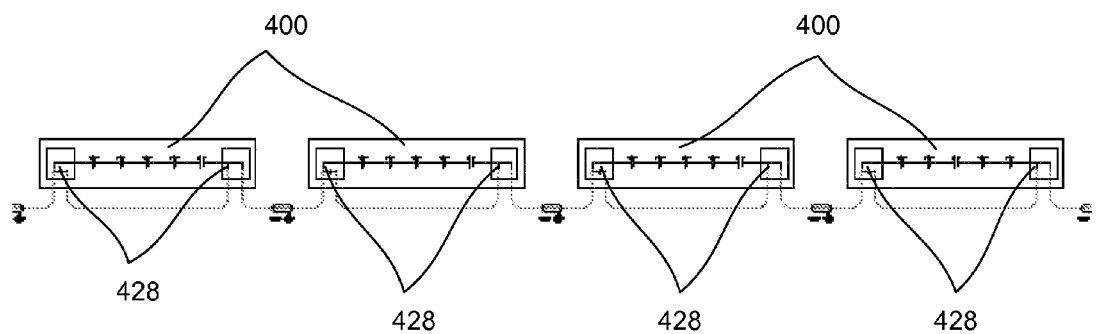

FIGS. 2A and 2B illustrate an example solar receiver. FIG. 2A illustrates an exploded view of the solar receiver. Each solar receiver 400 may have a plurality of heat sink fins 409, base plate 408, a first encapsulant layer 404a above the base plate, a plurality of PV or solar cells 406 above the first encapsulant layer 404a, a second encapsulant layer 404b above the plurality of solar cells 406, and a top protective sheet 402 above the second encapsulant layer 404b. The solar receiver 400 may be formed by any known process, such as lamination, and the like. Lamination is a process that consists of heating the solar receiver stack and applying pressure to fuse some or all the components together to form a laminate receiver structure. The lamination process may also occur in a vacuum environment to reduce air bubbles.

The base plate 408 may provide a backing for the plurality of solar cells 406 during lamination. The base plate 408 may be formed of an extruded metal, for example, aluminum, an extruded metal filled polymer, or any similar material. In one embodiment, the base plate 408 may be formed with mechanical features 420 extending outwardly from the base plate 408 to mechanically capture and position each of the solar cells 406. The base plate 408 may be wide enough to receive each of the plurality of solar cells 406. In one embodiment, the width of the base plate (W6) may be between about 80-85 mm. The length of the base plate 408, $L_{baseplate}$, may define the length of the solar receiver 400 and may be between about 1.0-6.0 m. In one embodiment, $L_{baseplate}$ may be about 1.897 m.

The base plate 408 may have a mating feature 412 to engage support structure 102. The mating feature 412 may have a width (W7) of between about 15-50 mm. The mating feature 412 may be any mechanical device to facilitate attachment of the base plate 408 to the support structure 102 such as clips, snap-fit, slideable mating members or the like.

The base plate 408 may have a low mass such that it allows for a reduced lamination cycle time as compared to traditional solar receiver lamination processes. In some embodiments, the base plate 408 has a layer of a thin conformable dielectric coating applied to provide redundant electrical insulation. The dielectric coating may be any known polymer and may be applied as a liquid or powder. The dielectric coating may be applied to the base plate 408 by any known means such as baking, painting, and the like. The dielectric coating may be thin to maintain a high thermal conductivity and may be between about 20-100 microns.

The first and second encapsulant layers 404a, 404b provide electrical isolation between the plurality of solar cells 406 and the base plate 408 to prevent conduction from the base plate 408 and electrical shorting of the plurality of solar cells 406. The encapsulant layers 404 may also protect the plurality of solar cells 406 from weather and moisture. Additionally, the encapsulant layers 404 may compensate for any differential thermal expansion between the plurality of solar cells 406 and the base plate 408.

The encapsulant layers 404 may be made of silicone, ethylene vinyl-polymer acetate (EVA), thermo-polymer urethane (TPU), or any other similar materials. Silicone is particularly well suited for use in solar applications because it is more resistant to ultra violet (UV) radiation than traditional EVA materials, which is particularly important in receivers utilized in conjunction with solar concentrators because the ultra violet radiation is concentrated as well. The encapsulant may be a poured or thermoplastic silicone that has a high light transmissibility and stability under more intense UV light.

The top protective sheet 402, although optional, may protect the plurality of solar cells 406 from moisture, air, contaminates, and the like. The top protective sheet 402 may be formed of any protective material such as Teflon® (such as DuPont Teflon Tefzel®, a modified ethylene-tetrafluoroethylene fluoropolymer (ETFE)), tempered or untempered glass, a fluoropolymer protective top-sheet, or any other similar materials. An optional anti-reflection or spectrally selective coating can be applied to the outer and/or inner surface of top protective sheet 402 to improve collector efficiency. In one embodiment, the top protective sheet 402 may be a thin, chemically-tempered glass having a thickness of between about 0.1 mm to 1 mm. In another embodiment, the glass may be a thick, thermally-tempered glass having a thickness of about 1 mm to 3 mm.

The top protective sheet 402 may be fabricated from a number of panes to reduce stress induced by differential thermal expansion between the top protective sheet 402 and the base plate 408. The individual panes in the top protective sheet 402 may have a small gap or expansion joint between them to allow for the differential thermal expansion. This gap may be between about 0.2 to 2.0 mm. In one embodiment, the gap may be about 1.0 mm.

In another embodiment, the gap between the panes may be sealed with a barrier material such as silicone, epoxy, butyl, or any other similar material that is compliant, optically transmissive, and seals out moisture and water.

Base plate 408, encapsulant layers 404, solar cells 406, and top protective sheet 402 may each have a thickness of between about 0.01-3.0 mm to provide for a low cost and light weight solar receiver 400. For example, the top protective sheet 402 may weigh less and be thinner than traditional 4 mm thick glass top protective sheets used in one sun collectors.

Each of the plurality of PV or solar cells 406 may be connected electrically in series to form a solar cell string 410 having a cell string axis 436. The solar cell string 410 may be formed by any known means such as soldering each solar cell together via interconnect wires or conductors (not shown). Each solar cell 406 may have a cell size of about 78×78 mm and may be a square wafer manufactured from a monocrystalline silicon boule. Alternatively, the solar cell may be any type of known solar cell such as multi-crystalline, single-crystalline, rear contact, emitter wrap-through, LGBC (laser grooved buried contact), PERL (passivated emitter with rear laterally diffused cell), multi-junction, silicon ribbon, thin film PV cells, and the like. Although each solar cell 406 is illustrated as a square, the shape of the solar cell 406 is not intended to be limiting as any shape may be used such as a rectangle, square with one or more rounded or truncated corners, hexagon, and the like.

The plurality of solar cells may be modified such that they have a lower series resistance when electrically connected. In one embodiment, the back surface field strength of the solar cell may be increased and the top-surface conductive grid may be thickened or increased in number to reduce the series resistance in traditional non rear-contact solar cells. In another embodiment, for rear contact PV cells, the back metallization of the solar cells may be thickened.

Each solar cell 406 may be positioned with a small gap between each other to allow room for electrical connections, differential thermal expansion, and mechanical tolerances. A single solar receiver 400 may have any number of solar cells 406 to form a cell string. In one embodiment, one solar receiver 400 may have about twenty four solar cells 406 and may be electrically connected in series, parallel, or any combination. Each solar cell 406 when illuminated may generate approximately ½ volt. Thus, if all cells are connected in series the single solar receiver 400 may generate a total of approximately 12 volts.

An electrical junction or connection, such as a junction box 428, may be coupled to the solar cell string 410 via connecting wires 414. The junction box 428 may be positioned on the front surface (shown in FIG. 2) or the back surface (not shown in FIG. 2), adjacent to solar cell string 410, at each end of the solar receiver 400.

FIG. 2B shows an exemplary electrical schematic of a section of the receiver 400 wiring. In this example, the individual solar cells are connected electrically in series. The junction boxes 428 are electrically connected at either end of the cell string. The junction box 428 may be electrically connected to a junction box of an adjacent solar receiver on one side of the solar receiver 400 and may be electrically connected to a second junction box located on the other side of the solar receiver 400. In one embodiment, the junction box 428 may have a bypass diode as further discussed in detail below. Some junction boxes may facilitate transfer of the power produced from each of the collectors 100 to an electrical system, such as a power generation plant, which may provide electrical energy for any end use. The junction box 428 thus facilitates an electrical connection between the receivers, provides strain relief for the cell string wiring, and allows for the addition and use of other devices that may be necessary, such as a bypass diode and the like.

Other solar receiver embodiments are discussed in co-pending patent Ser. No. 12/124,121, incorporated above and will not be discussed herein for brevity. Additionally, any of the embodiments described herein may be used in connection with any solar receiver embodiment described in U.S. patent application Ser. No. 12/340,379, entitled "Solar Receiver," filed Dec. 19, 2008 and U.S. Provisional Patent Application No. 61/180,694, entitled "Center Tapped Receiver," filed May 22, 2009, which are hereby incorporated by reference in their entirety for all purposes.

Figure 3:
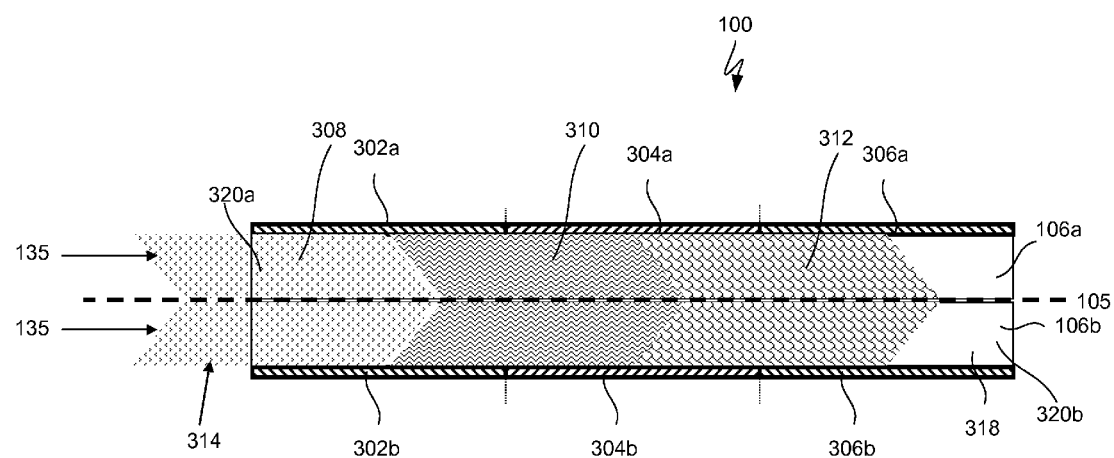
FIG. 3 illustrates a top view of a solar energy collector illustrating the reflecting area of incoming solar insolation for the solar energy collector.

As illustrated in FIG. 1A, the collector 100 may have multiple receivers 104 mounted on or near the edge of the trough to span the length of the collector 100. In operation, the collector tracks the incoming sunlight in at least one dimension or along one axis so that the incoming sunlight is aligned along the longitudinal axis 162 and so that the reflector panels 106 receive substantially uniform solar illumination. Despite the reflector panels receiving uniform illumination, some solar receivers may receive less or more solar radiation than other solar receivers. FIG. 3 illustrates a top view of a solar energy collector illustrating the reflecting area of incoming solar insolation for the solar energy collector. Although illustrated with three solar receivers, this is not intended to be limiting as any number of solar receivers may be used.

Solar receiver 302a is opposite solar receiver 302b, solar receiver 304a is opposite solar receiver 304b, and solar receiver 306a is opposite solar receiver 306b. Incoming solar insolation 135 that reflects in reflecting area 308 will be received by solar receivers 302a, b. Specifically, solar insolation reflected from reflector 106b is received at solar receiver 302a and solar insolation reflected from reflector 106a is received at solar receiver 302b. Incoming solar insolation 135 that reflects in reflecting area 310 will be received by solar receivers 304a, b. Specifically, solar insolation reflected from reflector 106b is received at solar receiver 304a and solar insolation reflected from reflector 106a is received at solar receiver 304b. Incoming solar insolation 135 that reflects in reflecting area 312 will be received by solar receivers 306a, b. Specifically, solar insolation reflected from reflector 106b is received at solar receiver 306a and solar insolation reflected from reflector 106a is received at solar receiver 306b.

Reflecting area 308 is smaller than reflecting areas 310 and 312 which results in less sunlight reflected onto receivers 302a, b since the unused sunlight in area 314 is not reflected by any reflectors. In other words, since there is no reflector to capture incoming sunlight in area 314 at the first end 320a of the collector 100, there is less solar radiation received by solar receivers 302a, b.

Additionally, sunlight received by reflectors 106a, b in area 318 at a second end 320b of collector 100 is also not used. Sunlight received by reflectors 106a, b in area 318 at the second end 320b is reflected out of the collector 100 and not received by any solar receivers. This is further illustrated by arrows A2 in FIG. 1D. Thus, sunlight in area 314 is unused, lost, and/or wasted, since there is no reflective structure to direct it to a receiver. Similarly, incoming solar insolation 135 in area 318 is unused, lost, and wasted, since although it is reflected off of reflectors 106a, b it is not directed toward any receivers. Rather, the reflected solar insolation 135 is concentrated in a region past the second collector end 320b and then dissipates into space, which may raise safety concerns.

Figure 4:
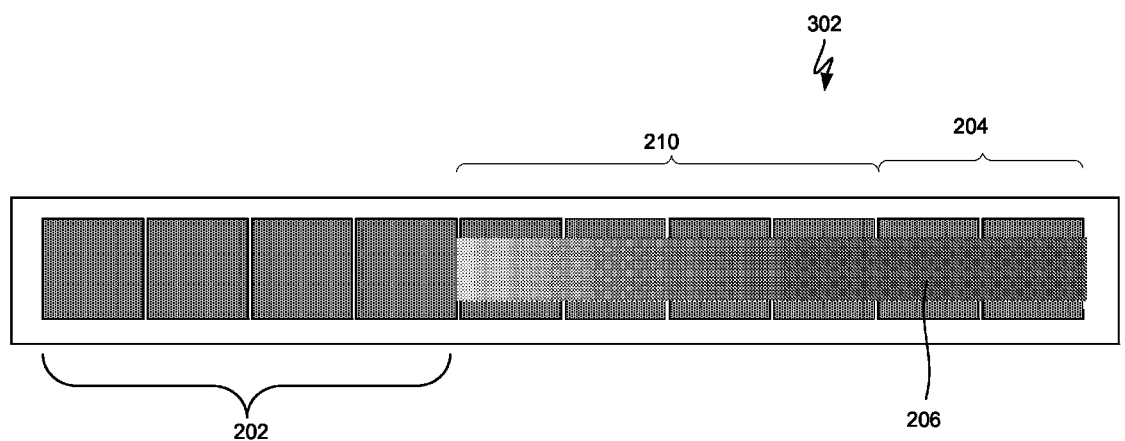
FIG. 4 illustrates an example representation solar irradiance pattern on the end solar receivers of FIG. 3.

FIG. 4 illustrates a representation solar irradiance pattern on the end solar receivers of FIG. 3. Depending on the angle of the incoming solar insolation, a portion of a solar receiver positioned at the end of the collector, such as solar receiver 302 in FIG. 3, will receive little or no solar irradiance. Thus, some of the PV cells 202 (also referred to as dark PV cells) in the end solar receiver 302 may not receive any solar irradiance and thus generate no current. In one example, for a 45° angle of incidence between the solar insolation 135 and the normal axis 160, the length of the dark PV cells will be at least equal to the trough depth. In a specific example, the trough depth, H1 (FIG. 1C), may be 0.36 m. If each PV cell has a length of 78 mm, at least 4 PV cells will not receive solar irradiance.

The remaining PV cells 204 in the solar cell string, after the dark PV cells 202, may receive solar irradiance to form a fully illuminated line of solar flux 206. The transition area between the dark PV cells 202 and the fully illuminated PV cells 204 may result in a gradient 210 in the flux line intensity since the PV cell in the transition area is only partially illuminated. The length of the gradient region 210 may exceed the length of the dark cells or fully illuminated cells.

If the PV cells are connected in series with no parallel bypass diodes, the dark or partially illuminated PV cells will result in the entire solar receiver generating little or no current. As discussed in detail below, a bypass diode may be used with the PV cells to direct current around the dark PV cells and allow the illuminated cells to generate useful energy.

Figure 5:
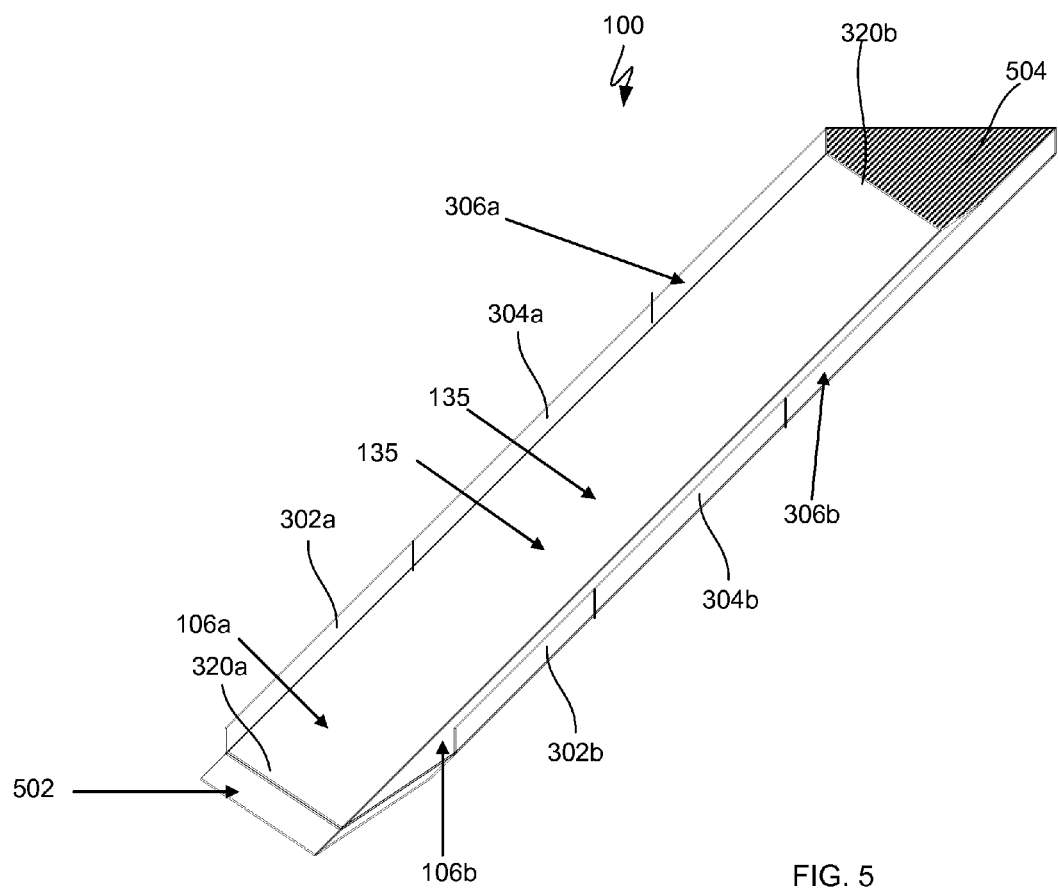
FIG. 5 illustrates a perspective top view of a portion of an example solar energy collector having end modifications.

FIG. 5 illustrates a perspective top view of a portion of the solar energy collector having end modifications. A reflector extender 502 may be positioned at the first end 320a of the collector 100 to collect incoming solar insolation from area 314 (FIG. 3). A solar end reflector 504 may be positioned at the second end 320b of the collector 100 to reflect sunlight reflected in area 318 (FIG. 3) toward solar receivers 306a,b.

However, although the reflector extender 502 is illustrated at first end 320a of the collector 100, the reflector extender 502 may also be positioned at second end 320b of the collector 100. Additionally, although the solar end reflector 504 is illustrated at second end 320b of the collector 100, the solar end reflector 504 may also be positioned at the first end 320a of the collector 100.

Furthermore, reflector extender 502 may be positioned at both ends 320a,b of the collector 100. As illustrated in FIG. 9 the sense of the angle of incidence may change during daily or seasonal operation and thus, at different times the incoming solar insolation may be directed towards either the first end 320a or the second end 320b of the collector 100.

The reflector extender 502 and solar end reflector 504 may be butted against the reflectors 106a,b and/or overlap the reflectors 106a,b by any know means such as with the use of adhesives, bolts, screws, clips, snap-fit, and the like. The reflector extender 502 and solar end reflector 504 may be made of the same materials as the reflectors 106a,b.

The reflector extender 502 may have the same profile as the trough. For example, the reflector extender 502 may have a curvature resembling that of a quarter section of a parabola as discussed with reference to FIG. 1C above. In other words, the curvature of the reflector extender 502 may approximate an arc of a circle or any other geometry that provide suitable concentration of the sunlight at the targeted receivers. However, reflector extender 502 may be formed in any shape that will intercept the incoming solar insolation to deflect the sunlight towards end receivers 302a,b. Solar end reflector 504 may be formed in any shape that will intercept and deflect the reflected sunlight towards the solar receivers. For example, the solar end reflector may be a simple flat shaped surface which will direct light, striking area 318, to receivers 306.

Figure 6:
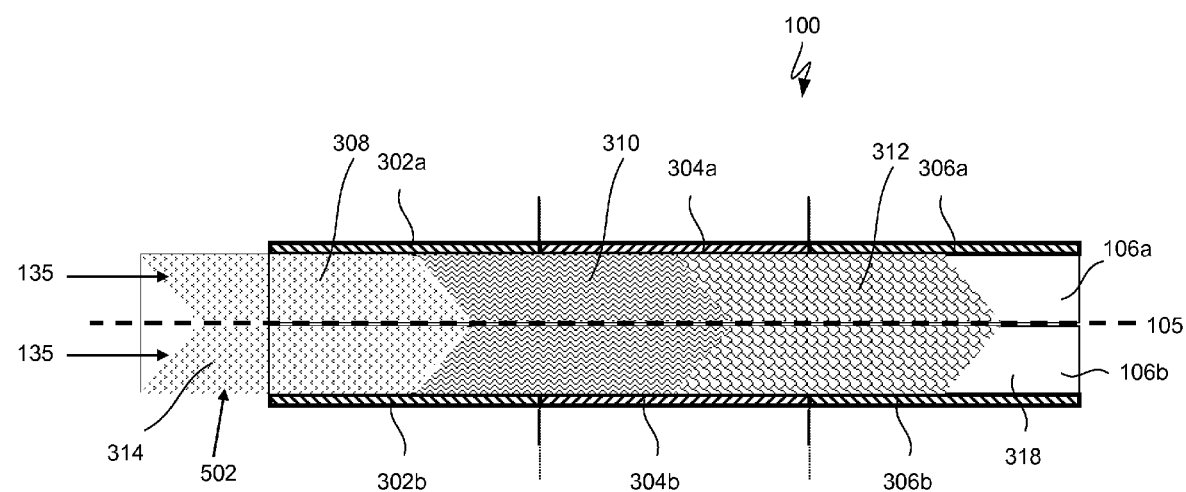
FIG. 6 illustrates a top view of an example solar energy collector illustrating the reflecting area of incoming solar insolation for the solar energy collector.
Figure 7:
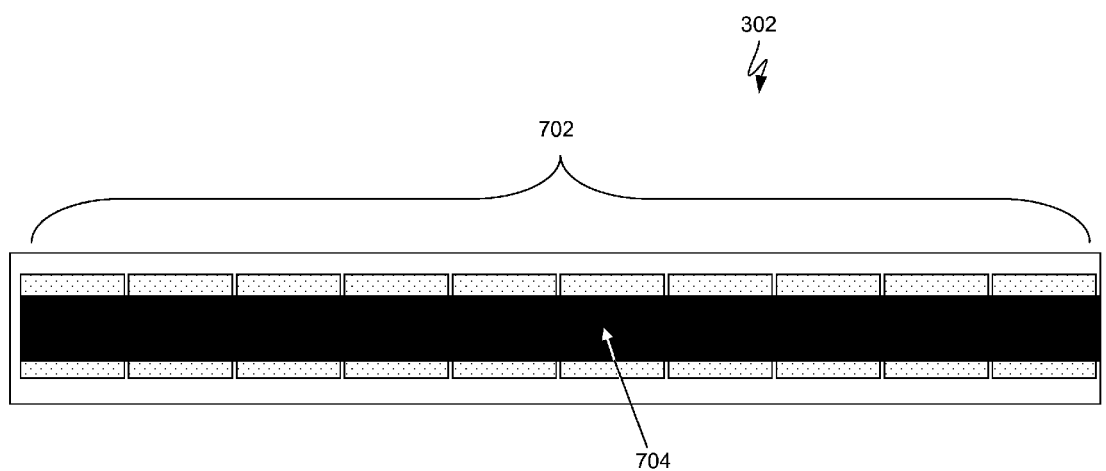
FIG. 7 illustrates an example representation solar irradiance pattern on the end solar receivers of FIG. 6.

The reflector extender 502 directs incoming solar insolation towards the dark PV cells 202 (FIG. 4) in solar receivers 302a,b, which formerly received no solar irradiance. FIG. 6 illustrates a top view of a solar energy collector illustrating the reflecting area of incoming solar insolation for the solar energy collector. As illustrated, all the incoming solar insolation 135 in reflecting area 314 is reflected from reflector extender 502 to solar receivers 302a,b. FIG. 7 illustrates a representation solar irradiance pattern on the end solar receivers of FIG. 6. As illustrated, all PV cells 702 in the cell string of the solar receiver 302 now receive equal solar radiance as shown by the uniform flux line 704.

In experimental tests, the reflector extender 502 increased the solar energy collector's electrical generation by between about 10% to about 20%. Additionally, the use of reflector extender provides for a higher effective ground coverage ratio, increased electrical energy generation, increased solar energy collector and solar receiver efficiency and allows for simpler solar receiver wiring, since there is a less of a need for bypass diodes.

Currently solar receivers used in trough-style solar energy collectors are all identical. In particular, the solar receivers' electrical configurations are all identical. For example, a bypass diode may be coupled in parallel to each solar cell in all the solar receivers. In another example, a group of solar cells in all the solar receivers have a parallel bypass diode. In yet another embodiment, a parallel bypass diode may be coupled to a series of connected solar receivers.

As stated above, to account for a possible PV cell mismatch, a bypass diode may be used. Any known bypass diode may be used to protect the solar cells from thermal destruction and maintain useful power output in case of total or partial shading, broken solar cells, or cell string failures. In use, the bypass diode may determine whether a solar cell or group of solar cells is limiting the output and divert current around the limiting solar cell or cells. In one example, if the threshold current is not met due to shadows, solar cell failure, or any other reason, the bypass diode may allow the current to flow around the solar cell thereby preventing a loss of output power. Although the use of bypass diodes for each solar cell is expensive and may not be cost efficient, it may be useful in solar receivers located at the ends of the collector.

In one embodiment, the solar receivers at the ends 320a,b of the collector 100 (302a,b and 306a,b in FIGS. 3 and 6) may be different than the solar receivers at the center of the collector 100 (304a,b of FIGS. 3 and 6). Namely, the end solar receivers may have individual bypass diodes, connected in parallel, for each PV cell in the solar receiver. The center solar receivers may use a single bypass diode, or one receiver bypass diode, for each solar receiver. Having bypass diodes in each PV cell allows current that is generated in the illuminated PV cells to flow around the non-illuminated PV cells and deliver useful output power. This is useful in receivers which may experience non-uniform illumination as discussed above. This is generally not an issue for the center solar receivers since the center solar receivers receive a uniform solar flux line.

Figure 8:
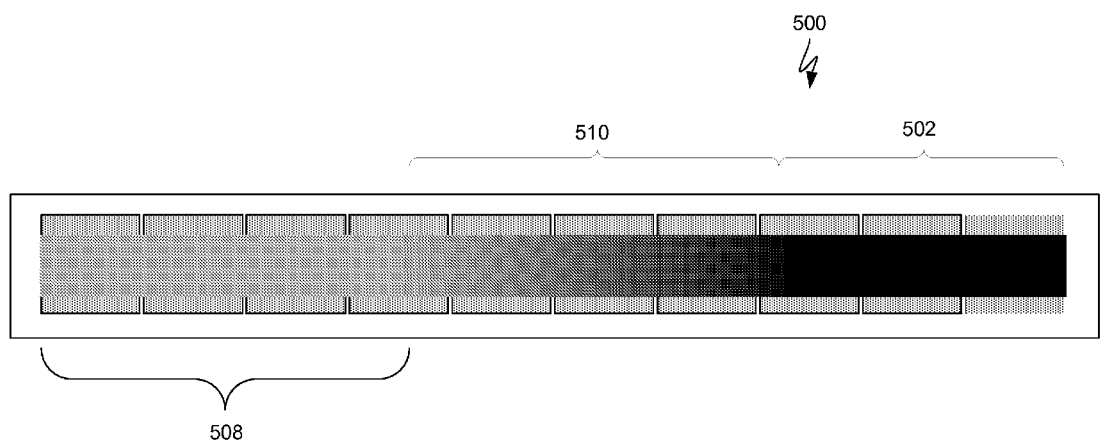
FIG. 8 illustrates an example representation solar irradiance pattern on a solar receiver near a solar end reflector.

In another embodiment, if a solar end reflector 504 (FIG. 5) is used and positioned at one end of the collector, some PV cells in the solar receivers positioned at the ends of the collector may receive double illumination as illustrated in FIG. 8. FIG. 8 illustrates an example representation solar irradiance pattern on a solar receiver near a solar end reflector. The solar receiver 500 may have some PV cells 508 having single illumination, some PV cells 502 receiving double illumination, and some PV cells 510 wherein there is a gradient between the double and single illumination. The double illumination PV cells 502 may receive sunlight directly reflected off reflector and some from the sunlight reflected off the solar end reflector. Thus, for the solar receivers at the end of the collectors, having bypass diodes on each PV cell allows extra current that is generated in the double illuminated PV cells to flow around the single illuminated PV cells and deliver useful output power. The type and size of PV cells may vary along the receiver length to match the varying flux line intensity.

In an alternative embodiment, the solar receivers positioned at the ends of the collector may be configured so that not all PV cells have a bypass diode. Namely, only the PV cells which may not be illuminated and/or receive less illumination in the solar cell string may have a bypass diode. For example, only each of the dark PV cells (202 of FIG. 4) may have a bypass diode. This reduces the cost of the solar receiver by eliminating unnecessary bypass diodes.

The use of different solar receivers at the end of the collector may generate more power from the collector and eliminate end losses in the end solar receivers of the collector. Furthermore, this allows low cost solar receivers to be used in the center of the collector, which has uniform solar radiance. Thus, this reduces the cost of the collectors as compared to collectors populated with identical solar receivers.

Other embodiments of the solar receivers at the ends of the collector may also be used. For example, different types or sizes of PV cells may be used in the end receivers than in the central receivers. In another example, the solar receivers at the ends of the collector may be in electrical communication with specialized junction boxes. In still another example, the solar receivers at the ends of the collector may have different heat sink configurations due to the temperature variance between the end and center solar receivers. The temperature variance may be caused by various reasons, such as non-uniform solar radiance, varying length and number of PV cells in the solar receiver, and the like. In still another example, the solar receivers at the ends of the collector may have a different length than the central solar receivers. The length of the end solar receivers may be approximately equal to the length of the area of non-uniform solar irradiation.

Figure 10:
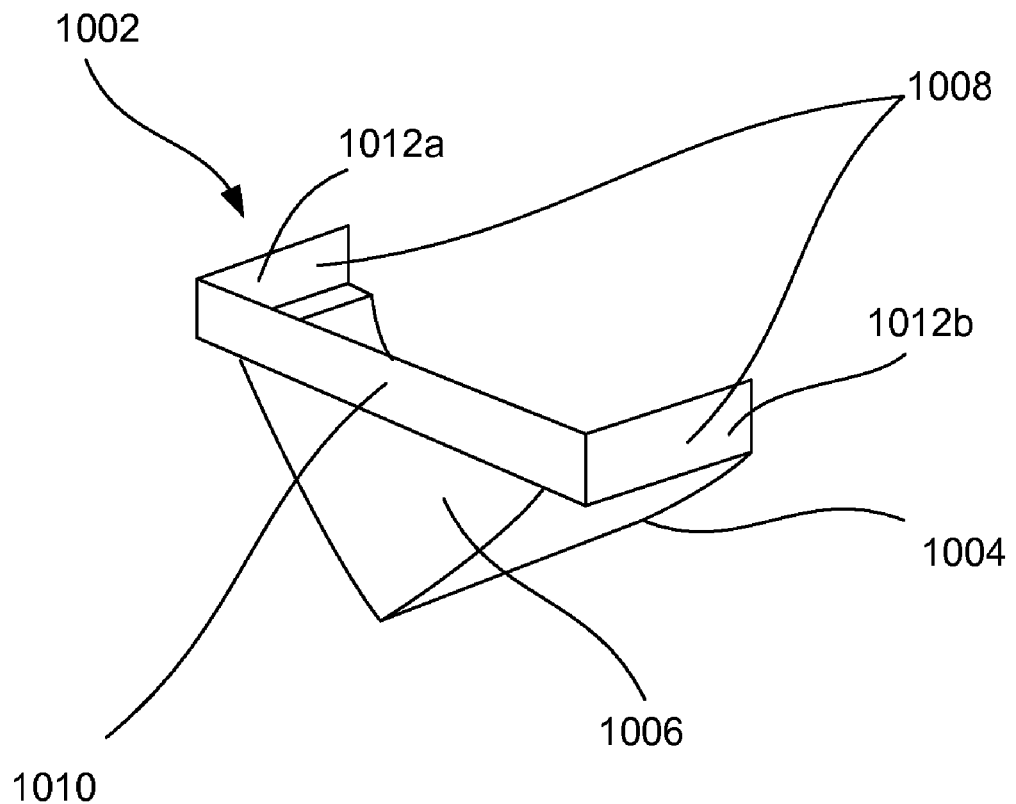
FIG. 10 illustrates an extended end reflector according to one embodiment of the present invention.

Referring now to FIG. 10, an extended end reflector 1002 will be described according to one embodiment of the present invention. By combining aspects of the reflector extender 502 and the solar end reflector 504 of FIG. 5 in a single structure, the extended end reflector 1002 can help reflect light towards under-utilized solar receivers at the end of an attached collector and prevent reflected light from escaping the collector. The extended end reflector 1002 includes a reflector extender 1004, an end cap 1006 and a receiver extension region 1008. One end of the reflector extender 1004 is covered with the end cap 1006. The opposite end of the reflector extender 1004 can be attached with an end of a trough 120 and serve to extend its reflector panels 106 in a substantially continuous fashion (e.g., the trough 120 of the collector 100 of FIG. 1.) The receiver extension region 1008 is coupled with top edges of a trough-shaped section of the reflector extender 1004.

The reflector extender 1004 of the extended end reflector 1002 can serve a purpose similar to that of the reflector extender 502 of FIG. 5. The reflector extender 1002 includes a trough-shaped section whose inner reflective surfaces may have a shape, composition and/or curvature substantially the same as that of the reflector extender 502 of FIG. 5 and/or the reflector panels 106 of the collector 100. When the reflector extender 1002 is attached to the collector 100 of FIG. 1, the reflector extender 1002 extends reflective surfaces of the reflector panels 106 and helps reflect light towards one or more solar receivers positioned at or near an end of the collector 100.

The end cap 1006, which covers one end of the reflector extender 1002, may function in a manner similar to that of the solar end reflector 504 of FIG. 5. When the extended end reflector 1002 is attached to the collector 100, the end cap 1006 is arranged to help receive and scatter light rays that would otherwise exit the reflective trough 106 of the collector 100. In the illustrated embodiment, the end cap includes an end cap surface that is arranged to be substantially perpendicular to the longitudinal axis 162 of the attached collector 100 of FIG. 1A, although the end cap 1006 may also be angled and positioned in a wide variety of other ways relative to the collector 100 and the reflector extender 1002. Additional embodiments involve an end cap surface that is arranged to reflect light towards one or more solar receivers on the attached collector 100. In some implementations, the end cap surface may be suitably textured (e.g., be sandblasted, unpolished, etc.) such that it does not specularly reflect but instead scatters incoming light rays.

The receiver extension region 1008, which is coupled with a top edge of the reflector extender 1002, is arranged to help contain and scatter reflected light. As discussed previously in connection with FIG. 1C, the collector 100 includes a trough 120 arranged to reflect light towards a location near the top edge of the trough 120. Along much of the trough 120, a solar receiver 104 is mounted appropriately to capture such rays. As discussed previously in connection with rays illustrated by arrows A2 of FIG. 1D, however, high energy light rays may escape out of the end of the trough if there is no structure properly positioned to receive them. When the extended end reflector 1002 is attached to the trough 120, the receiver extension region 1008 is positioned to block light that might otherwise escape the trough 120 at the level of the solar receivers 104.

Accordingly, the reflector extension region 1008 may be generally aligned with the one or more solar receivers on the trough 120. By way of example, surfaces of the reflector extension region 1008 and surfaces of the extended reflector 1004 may be sized and arranged relative to one another in a manner similar to that of the solar receivers 104 and the reflectors 132 of FIG. 1C, respectively. In the illustrated embodiment, the receiver extension region includes a receiver extension surface 1012 that is substantially coplanar with a solar cell face of a solar receiver 104 on the trough 120, although this is not a requirement. Some implementations involve a receiver extension region 1008 that is formed integrally with the reflector extender 1004 (e.g., pressed or stamped from a single piece of metal). In other embodiments, the reflector extender 1004 and the receiver extension region 1008 are separately formed, welded, bolted and/or otherwise attached to one another.

The extended end reflector 1002 may include an optional end wall 1010. The end wall 1010 is generally arranged to block light that would otherwise exit out of an end of the collector 100. In various implementations, the end wall 1010 is attached with a top edge of the end cap 1006 and/or is positioned above and outside a trough aperture formed by the reflector extender 1004 and the end cap 1006. In the illustrated embodiment, the receiver extension region 1008 includes two opposing reflector extender surfaces 1012a, b that are both connected to and positioned substantially perpendicular to the end wall 1010, although a wide variety of other arrangements are also possible.

The components of the extended end reflector 1002 (i.e., reflector extender 1004, the receiver extension region 1008, the end cap 1006 and the end wall 1010) may be made of any material suitable for reflecting or scattering light, as appropriate. By way of example, some or all of the components of the extended end reflector 1002 may be formed from sheets of metal e.g, steel, aluminum, etc. The components may be designed to be assembled on-site using any appropriate means, such as welding, bolting, screws, latches, pressure fittings, etc. In various embodiments, the extended end reflector 1002 is partially or completed prefabricated and/or is arranged to be attached as a single structure to the end of a collector 100.

Figure 11A:
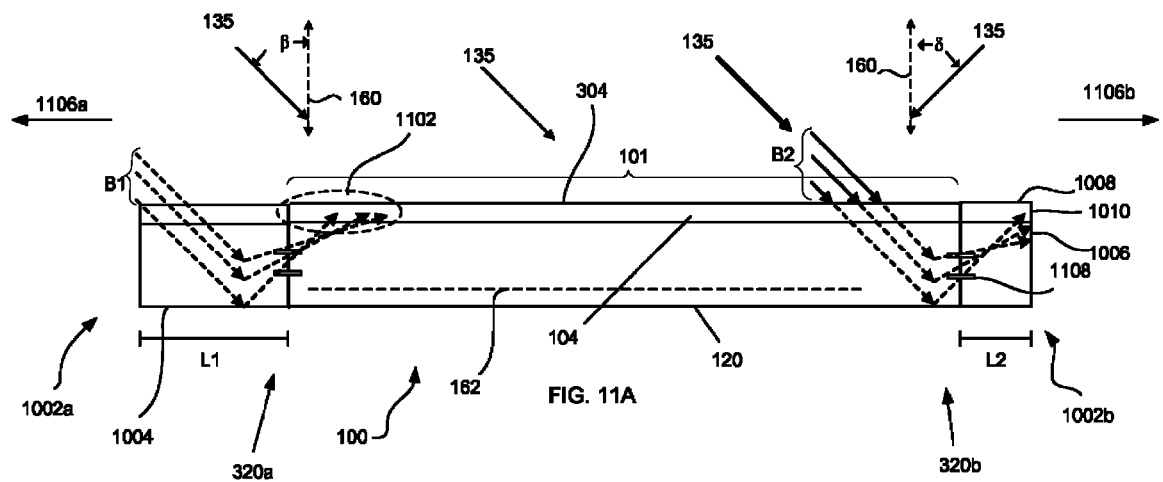
FIGS. 11A and 11B illustrate side and perspective views of a collector with attached extended end reflectors according to another embodiment of the present invention.
Figure 11B:
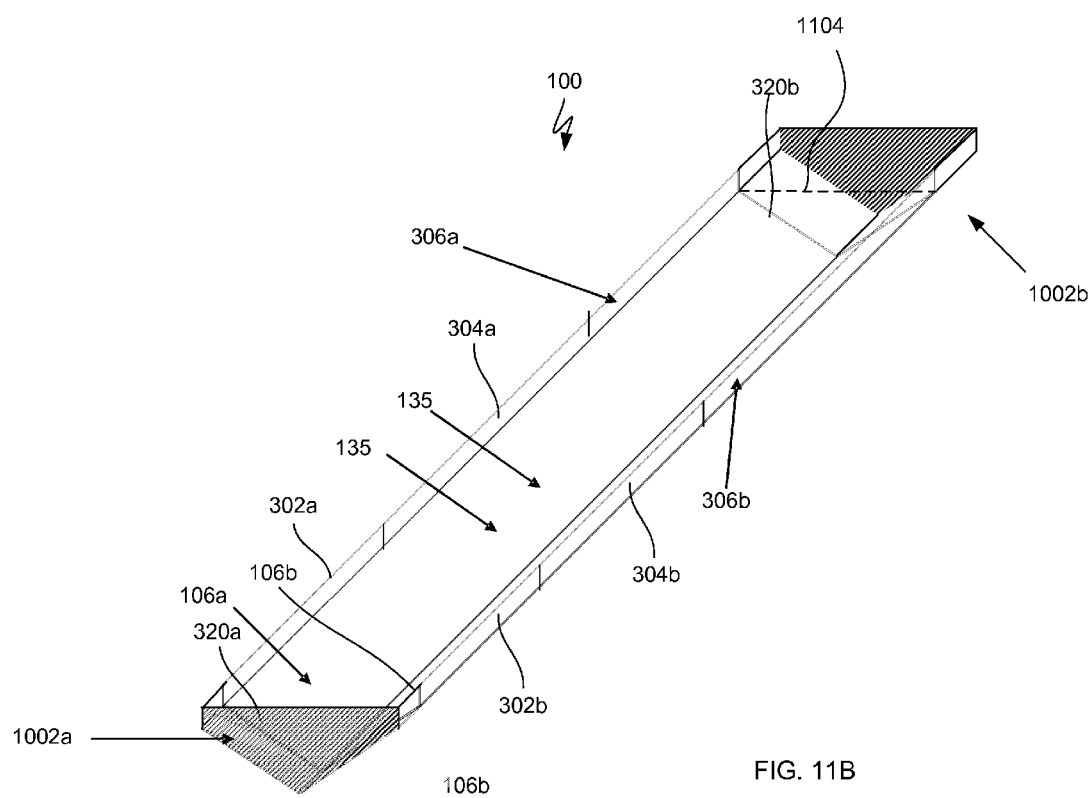

Referring next to FIGS. 11A and 11B, an exemplary solar energy collector 100 with attached extended end reflectors 1002 will be described. FIGS. 11A and 11B provide side and perspective views of the collector 100 and its associated extended end reflectors 1002. The solar energy collector 100 is similar to the solar energy collector 100 illustrated in FIG. 1, except that the extended end reflectors 1002a, 1002b have been attached to first and second ends 320a and 320b of the collector 100. In the illustrated embodiment, each of the extended end reflectors 1002a, 1002b may be similar to the extended end reflector 1002 of FIG. 10.

In the illustrated embodiment, the extended end reflectors 1002 help improve the electrical performance of the collector 100 and prevent the undesirable escape of reflected light from the collector 100. Light rays, as illustrated by arrows B1, are reflected by the reflector extender 1004 of the first extended reflector 1002a towards one or more end solar receivers 1102, which, as discussed earlier in connection with FIGS. 3 and 4, might otherwise by underutilized due to their location at the edge and/or end of the reflective trough 120. Additionally, light rays, as illustrated by arrows B2, rather than exiting the collector 100 entirely, are instead blocked by the extended end reflector 1002b, the receiver extension region 1008, the end wall 1010 and/or the end cap 1006.

Generally, the structure and/or dimensions of the extended end reflector 1002 at an end 320 of the collector 100 may help determine the degree to which incoming solar insolation 135 is received and redirected towards end receivers (e.g., end receivers 1102) situated at the same end 320 of the collector 100. In the illustrated embodiment, rays of incoming solar insolation 135, as illustrated by arrows B1, are received by the corresponding extended end reflector 1102a at an angle β and are redirected towards end receivers 1102. A review of FIG. 11A reveals that if the angle β were increased, the length L1 of the extended end reflector 1002a may have to be increased to achieve the same effect of redirecting the light towards end receivers 1102. If the angle of incidence β were decreased, the length L1 could be shortened while achieving the same effect. When incoming solar insolation 135 is coming from the opposing sense 1106b and at an angle δ, the structure of corresponding extended end reflector 1002b may play a similar role in reflecting and redirecting light towards end receivers near the second end of the collector 320b.

It should be appreciated that each extended end reflector 1002a, b does not necessarily have the same dimensions or structural arrangement. For example, each extended end reflector 1002 can be arranged to accommodate different maximum angles of incidence of incoming solar insolation 135. As discussed previously in connection with FIG. 9, the angle of incidence at which the collector 100 receives incoming solar insolation 135 may vary over time. At certain times, incoming solar insolation 135 comes at least partially from a first direction or sense 1106a and has an angle with the normal axis 160 of β, where β is a positive value. At other times, incoming solar insolation 135 comes at least partially from a second direction or sense 1106b that is opposite of the first direction or sense 1106a and has an angle with the normal axis 160 of δ, where δ is a positive value. (The angle of incidence α may be understood as the angle between the incoming solar insolation 135 and a normal axis 160 and always is positive, so that when incoming solar insolation is coming from the sense 1106a, α=β and when incoming solar insolation is coming from the sense 1106b, α=δ)

Over time, the angles of incidence β and δ may have different maximum values. As discussed earlier in connection with FIG. 9, the maximum angles of incidence in turn are influenced by the global position of the collector 100. By way of example, assume that the collector is situated at 33° latitude, the first end 320a of the collector 100 is pointed directly north, and the second end 320b of the collector 100 is pointed directly south. Based on these assumptions and the curves of FIG. 9, the maximum angle of incidence would be approximately 56.5° for southerly incoming rays and 28° for northerly incoming rays. That is, the maximum angle of incidence δ corresponding to the southerly pointed, second end 320b of the collector 100 would be roughly double the maximum angle of incidence β of the northerly pointed first end 320a of the collector 100.

To accommodate the different maximum angles of incidence associated with opposing ends 320 of the collector 100, various embodiments of the present invention involve attaching differently sized and structured extended end reflectors 1002 to the same collector 100. To conserve material and minimize production costs, it may be desirable to minimize the length of the extended end reflector 1002 while maximizing the allowance of solar insolation 135. In some embodiments, the extended end reflector 1002a is arranged to allow incoming solar insolation at any positive angle of incidence β up to the corresponding maximum angle of incidence. A wide variety of approaches may be undertaken to determine an ideal length L1, L2 for an extended end reflector 1002. By way of example, the following equation may be used to determine a minimum reference length:

$$L = \tan(AOI_{max}) * W_t$$

where L=a reference length for an extended end reflector 1002, $AOI_{max}$ is the corresponding maximum angle of incidence and $W_t$ is the width 1104 of FIG. 11B of the trough aperture of the collector 100 (also shown in FIG. 1C). Generally, $W_t$ refers to a maximum width of the trough aperture or a width measured between top edge portions of the trough, although this measurement may vary depending on the arrangement of the reflective trough. Various implementations of an attached extended end reflector 1002 have a length that is at least L and/or approximately between 0.8 L and 1.2 L.

Differently sized extended end reflectors 1002 may be used to rapidly adapt a collector 100 to local light conditions. In one exemplary method, a collector without extended end reflectors (e.g., the collector 100 of FIG. 1) is initially set up at a collector site. As discussed earlier, the aforementioned maximum angles of incidence that correspond to each end 320 of the collector 100 may differ depending on the location of the collector site on the earth. Multiple prefabricated extended end reflectors 1002 can be provided for attaching to either end of the collector 100. The prefabricated extended end reflectors 1002 may have a wide variety of substantially different lengths designed to accommodate different maximum angles of incidence, as discussed above in connection with FIGS. 11A and 11B. To use one simple example, at least 3 extended end reflectors 1002 with different lengths designed to accommodate maximum angles of incidence of 20°, 40° and 60°, respectively, may be provided. After the maximum angle of incidence is known for each end of the collector 100, a reference length may be determined based on the maximum angle of incidence. The reference length may be determined in any suitable manner (e.g., using the equation discussed in the previous paragraph.) Afterwards, an extended end reflector 1002 with a length that is closest to the reference length may be selected and attached to the corresponding end 320 of the collector 100. Some of these steps may be repeated to attach another extended end reflector 1002, possibly of a substantially different length, to the other end 320 of the collector 100. In some implementations, ends 320 of the extended end reflector 1002 and the collector 100 may be equipped with holes, latches and/or other fixtures to facilitate the rapid attachment of the extended end reflector 1002. For example, in the embodiment illustrated in FIG. 11A, each extended end reflector 1002 is secured to an end 320 of the collector 100 using one or more bolts 1108, which pass through aligned holes in both the extended end reflector 1002 and the collector 100. Some approaches involve attaching extended end reflectors of different lengths to an end of a collector one or more times during the year (e.g., twice a year, before the start of each season, etc.), since the maximum angles of incidence can vary over the course of a day, year or season.

Figure 12:
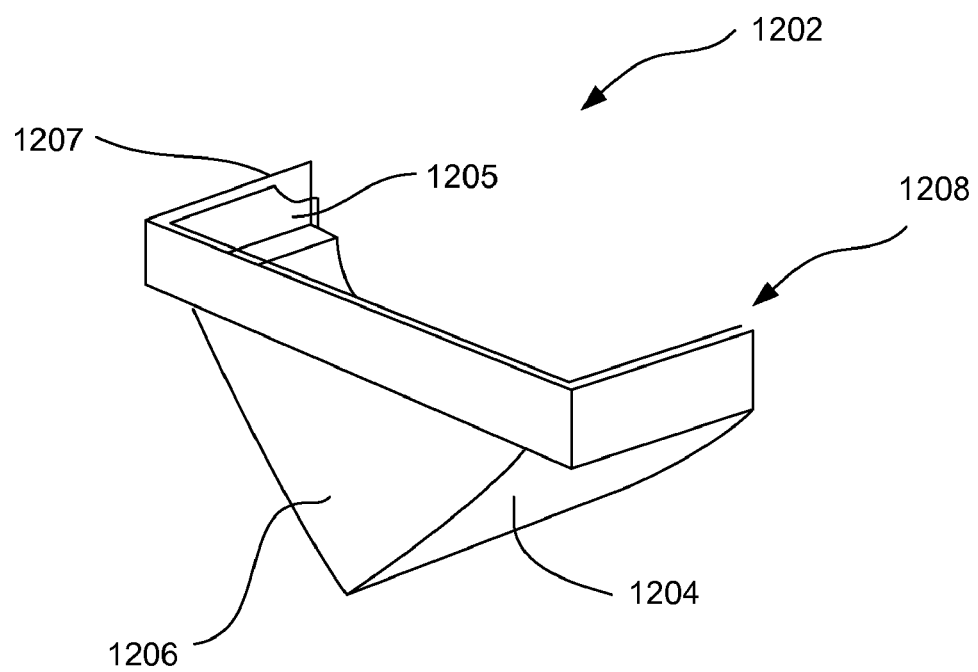
FIG. 12 illustrates an extended end reflector with a double walled section according to another embodiment of the present invention.

Referring now to FIG. 12, another embodiment of an extended end reflector 1202 will be described. Extended end reflector 1202 includes an end cap 1206, reflector extender 1204 and a receiver extension region 1208 and may be quite similar to the extended end reflector 1002 of FIG. 10. To clarify its composition, a portion of the receiver extension region 1208 has been cut away to reveal an inner wall 1205 and an outer wall 1207. This double walled structure facilitates handling of the extended end reflector 1202 by helping to limit its external temperature. The inner wall 1205 and the outer wall 1207 may be arranged in any manner suitable for inhibiting the conduction of heat from the inner wall 1205 to the outer wall 1207. By way of example, the opposing inner and outer walls 1205 and 1207 may be separated by a gap, which may be filled at least in part by air and/or a thermal insulating material. In various embodiments, the inner and outer walls 1205 and 1207 are separated and held in place by spacers, screws, etc. Any suitable portion of the extended end reflector 1202 may have a double walled section e.g., the end cap 1206, etc.

While embodiments and applications of this invention have been shown and described, it would be apparent to those skilled in the art having the benefit of this disclosure that many more modifications than mentioned above are possible without departing from the inventive concepts herein. By way of example, the reflector extender 502 and the solar end reflector 503 of FIG. 5 may be modified using any feature described in connection with the reflector extender 1004 and end cap 1006 of FIG. 10 and vice versa. Any feature that is described in connection with a structure illustrated in one figure may be used to modify a corresponding structure illustrated in another figure. Additionally, steps may be added or modified as appropriate to any of the method embodiments described herein to build any of the collectors or extended end reflectors described herein. In some implementations, the difference in length between the first and second extended end reflectors 1002a and 1002b of FIG. 11A, which are both attached to the same collector 100, can be quite large e.g., the first extended end reflector 1002a can be at least twice as long as the second extended end reflector. This could be the case, for example, in a situation where the first extended end reflector 1002a is designed to accommodate a maximum angle of incidence of 40° and the second extended end reflector 1002b is designed to accommodate a maximum angle of incidence of 20°, since tan (40°)/tan (20°)=~2.3. Additionally, some implementations involve extended end reflectors 1002 of FIG. 11A having dimensions that are the same or greater than those of the attached reflective trough 120 and/or the solar receiver 304. For example, the receiver extension region 1012 preferably has a height that is substantially the same or greater than the height of the solar receivers 304. The reflector extender 1004 preferably has a height that is substantially the same or greater than the height of the attached reflective trough 120. (In the context of the embodiment of FIG. 11A, height can be understood as a measurement of a dimension that runs perpendicular to lengths L1 and L2.) Such dimensions may help limit the undesirable escape of light from the collector 100. Therefore, the present embodiments should be considered illustrative and not restrictive and the invention is not to be limited to the details given herein, but may be modified within the scope and equivalents of the appended claims.

What is claimed is:

1. A concentrating solar energy collector, which tracks movements of the sun along one axis, the collector comprising:
   a reflector having a length, a longitudinally extending axis, a first end and a second end;
   one or more solar receivers arranged in a longitudinally extending row and positioned to receive sunlight reflected by the reflector; and
   an end unit coupled to the first end of the reflector, wherein the end unit includes a reflector extender having a cross-sectional shape that matches that of the reflector such that the reflector extender helps to extend reflective surfaces of the collector beyond the reflector, the reflector extender having a first end and an opposing second end, the first end of the reflector extender being coupled with the first end of the reflector, and an end cap that covers and is coupled with the second end of the reflector extender.

2. The collector of claim 1, wherein:
   an end solar receiver of the one or more solar receivers is mounted at the first end of the reflector and is positioned near an edge of the reflector; and
   the reflector extender is attached to the first end of the reflector and is arranged to receive incoming sunlight and direct at least some of the received incoming sunlight towards the end solar receiver.

3. The collector of claim 1, further comprising a receiver extension that is arranged to extend the solar receiver row at a longitudinal position adjacent at least a portion of the reflector extender wherein the receiver extension does not include any solar cells that are arranged to convert received sunlight to electricity and is arranged to receive and scatter light that is reflected thereto.

4. The collector of claim 3, wherein the receiver extension region is double walled and includes first and second receiver extension surfaces that oppose one another and that are separated by an air gap.

5. The collector of claim 1, wherein the end cap has an end cap surface that is substantially perpendicular to the longitudinal collector axis.

6. The collector of claim 1, wherein the end cap has an end cap surface that is arranged to scatter received light without specularly reflecting the received light.

7. The collector of claim 1, wherein the end cap has an end cap surface arranged to direct light reflected off of the reflector towards the one or more solar receivers.

8. The collector of claim 1, wherein:
   the collector is positioned at a collector site, incident sunlight being received at the collector site up to a maximum angle of incidence during a year;
   the reflector extender being arranged to insure that a first end of the solar receiver row will receive reflected sunlight at all times when the incident sunlight has an angle of incidence up to and including the maximum angle of incidence.

9. The collector of claim 8, further comprising a second end unit wherein:
   the second end unit includes a second reflector extender attached to a second end of the reflector;
   the lengths of the first and second reflector extenders are substantially different.

10. The collector of claim 3, wherein the reflector extender and the receiver extension are at least one selected from the group consisting of: 1) welded together; 2) formed integrally from a single piece of metal; and 3) formed from distinct pieces of metal and attached to one another.

11. The collector of claim 1, wherein the reflector extender is secured to the first end of the reflector by a plurality of bolts, the reflector extender and the first end of the reflector each including a plurality of holes, each bolt extending through aligned holes in the reflector extender and the first end of the reflector.

12. The collector of claim 1, wherein a section of the end cap is doubled walled and includes first and second opposing end cap surfaces that are separated by an air gap.

13. The collector of claim 3, wherein the receiver extension includes a receiver extension surface that is substantially coplanar with faces of the solar cells.

14. The collector of claim 1, wherein the reflector is formed from a plurality of longitudinally aligned reflector segments.

15. The collector of claim 1, wherein a first edge of the receiver row is substantially longitudinally aligned with a first edge of the reflector.

16. The collector of claim 1, wherein:
first and second edges of the solar receiver row are substantially longitudinally aligned with first and second edges of the reflector; and
at some angles of incidence, a portion of the incident sunlight reflected by the reflector will be reflected to a position longitudinally outside of the solar receiver row and the end cap is arranged to redirect at least a portion of such reflected sunlight that initially misses the solar receiver row back towards the at least one solar receiver.

* * * * *